United States Patent
Fukagai

(10) Patent No.: US 6,385,225 B1
(45) Date of Patent: May 7, 2002

(54) WINDOW TYPE SEMICONDUCTOR LASER LIGHT EMITTING DEVICE AND A PROCESS OF FABRICATING THEREOF

(75) Inventor: Kazuo Fukagai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/567,080

(22) Filed: May 8, 2000

(30) Foreign Application Priority Data

May 11, 1999 (JP) .......................................... 11-130663

(51) Int. Cl.[7] .......................... H01S 5/00; H01L 27/15; H01L 31/12; H01L 33/00
(52) U.S. Cl. ............................. 372/46; 372/44; 372/45
(58) Field of Search ............................ 372/44, 45, 46; 257/80, 81, 82, 83, 84, 85, 94, 95, 96, 97; 438/689

(56) References Cited

U.S. PATENT DOCUMENTS

| | | | | |
|---|---|---|---|---|
| 4,618,959 A | * | 10/1986 | Mito ............................ | 372/46 |
| 4,757,509 A | * | 7/1988 | Isshiki et al. ................. | 372/45 |
| 4,951,289 A | * | 8/1990 | Shima ......................... | 372/46 |
| 4,980,895 A | * | 12/1990 | Nishimura .................... | 372/96 |
| 4,984,243 A | * | 1/1991 | Kagawa et al. ............... | 372/46 |
| 5,115,443 A | * | 5/1992 | Miyazawa ................... | 372/46 |
| 5,400,355 A | * | 3/1995 | Ishida .......................... | 372/46 |
| 5,436,924 A | * | 7/1995 | Kamei et al. ................. | 372/46 |
| 5,495,493 A | * | 2/1996 | Kurihara et al. .............. | 372/46 |
| 5,541,950 A | * | 7/1996 | Kizuki et al. ................. | 372/46 |
| 5,684,818 A | * | 11/1997 | Anayama et al. ............. | 372/46 |
| 6,028,876 A | * | 2/2000 | Lee et al. ..................... | 372/46 |
| 6,151,351 A | * | 11/2000 | Kito et al. .................... | 372/96 |
| 6,278,173 B1 | * | 8/2001 | Kobayashi et al. ......... | 257/627 |

FOREIGN PATENT DOCUMENTS

| | | | |
|---|---|---|---|
| JP | 56-8890 | | 1/1981 |
| JP | 64-42884 | | 2/1989 |
| JP | 3-14281 | | 1/1991 |
| JP | 5-67837 | | 3/1993 |
| JP | 405167179 A | * | 7/1993 |
| JP | 405167180 A | * | 7/1993 |
| JP | 405175612 A | * | 7/1993 |
| JP | 405183237 A | * | 7/1993 |
| JP | 406029621 A | * | 2/1994 |
| JP | 406061581 A | * | 3/1994 |
| JP | 6-112588 | | 4/1994 |
| JP | 406097593 A | * | 4/1994 |

* cited by examiner

*Primary Examiner*—Matthew Smith
*Assistant Examiner*—Chuong Anh Luu
(74) *Attorney, Agent, or Firm*—Sughrue Mion, PLLC

(57) ABSTRACT

A window type semiconductor layer light emitting device has a compound semiconductor structure including a first clad layer formed on a crystal plane closer to (100) plane, an active layer formed on the first clad layer and a second clad layer formed on the active layer and window layers grown on both sides of the compound semiconductor structure, and the buried window layers are epitaxially grown on the side surfaces of the compound semiconductor structure by restricting the epitaxial growth in a vertical direction to the crystal lane so that the upper surfaces of the buried window layers are substantially coplanar with the upper surface of the second clad layer, thereby decreasing the coupling loss.

8 Claims, 3 Drawing Sheets

WINDOW TYPE SEMICONDUCTOR LASER LIGHT EMITTING DEVICE AND A PROCESS OF FABRICATING THEREOF

FIELD OF THE INVENTION

This invention relates to a window type semiconductor laser light emitting device and a process for fabricating the window type semiconductor laser light emitting device.

DESCRIPTION OF THE RELATED ART

The internet has rapidly spread far and wide, and the audiographics are drastically improved. The development is achieved on the basis of the large-capacity optical transmission technologies such as, for example, the optical fiber amplification/wavelength division multiplex communication technologies. A low-power consumption low-noise semiconductor laser light emitting device for 1 micron wavelength is used as a light source for optical pumping in the optical fiber amplification technology. When the semiconductor laser light emitting device is employed in the wavelength division multiplex communication system, the wavelength division multiplex communication system requires a high-power semiconductor laser light emitting device, the output power of which is proportional to the amplification ratio.

Crystal degradation called as "optical abrasion" is well known to skilled person. The optical abrasion is the phenomenon that the crystal at the end surface of the active layer is degraded due to the high-power laser light output. The optical abrasion proceeds as follows. The laser light is generated in the active layer, and is emitted from the end surface. While the laser light is being radiated from the end surface of the active layer, the surface state at the end surface absorbs part of the laser light, and the active layer generates heat. The heat makes the band gap around the end surface narrower. The narrow band gap absorbs the laser light more than before, and, accordingly, promotes the heat generation. The undesirable feedback loop results in the degradation of the crystal around the end surface, and malfunction takes place in the semiconductor laser emitting device. The optical abrasion is serious in the semiconductor laser light emitting device of 0.6–1 micron wavelength.

A window is effective against the optical abrasion. The window is implemented by using a buried layer wider in band gap than the active layer. The buried layer is transparent to the laser light by virtue of the wide band gap, and forms a window region at the end surface of the active region.

The prior art window type semiconductor laser light emitting device is fabricated as follows. A double heterojunction structure is formed on a semiconductor substrate, and forms a semiconductor laminated structure together with the semiconductor substrate. The semiconductor layers are partially removed from the semiconductor laminated structure for forming the window, and the semiconductor laminated structure is shaped into a striped mesa. The periphery of the striped mesa structure is covered with semiconductor material, which is transparent to the oscillating laser light and electrical insulating. Part of the transparent semiconductor layer serves as the window or the buried layer.

A problem is encountered in the prior art semiconductor laser light emitting device of the type having the striped mesa structure covered with the semiconductor transparent layer in serious coupling loss in the window region. The serious coupling loss is derived from the optical properties of the transparent semiconductor layer. The transparent semiconductor layer does not have any wave-guide in the window region in both of the vertical direction and the horizontal direction. The oscillating laser light is radiated from the internal active region of the resonator toward the boundary between the buried layer and the active layer, and is reflected on the end surface of the resonator. The reflection goes to and comes back in the window region. While the reflection is going to and coming back, the beam shape is deformed, and is coupled to the internal active region, again. When the laser light beam is coupled to the internal active region, energy loss takes place. The energy loss is referred to as "coupling loss". Increase of the coupling loss results in decrease of the external differential quantum efficiency. Thus, the prior art window type semiconductor laser light emitting device has the problem in that the external differential quantum efficiency is low. Since the boundary is not perfectly perpendicular to the longitudinal direction of the resonator, the laser light beam is bend around the boundary of the buried layer. This results in that the output laser light beam inclines from the longitudinal direction of the resonator toward the vertical direction. Thus, the prior art window type semiconductor laser light emitting device has another problem in that the output laser light beam inclines. Research and development efforts are being made on a solution of the problems.

A solution is disclosed in Japanese Patent Publication of Unexamined Application (laid-open) No. 3-14281. FIG. 1 illustrates the prior art window type self-aligned semiconductor laser light emitting device disclosed therein.

The prior art window type self-aligned semiconductor laser light emitting device is fabricated as follows. On an n-type GaAs substrate 31 are formed an n-type $Al_yGa_{1-y}As$ clad layer 32, an active layer 33, a p-type $Al_yGa_{1-y}As$ clad layer 34 and a p-type GaAs cap layer 35 which are successively grown by using a metal organic vapor phase epitaxial growing technique. Only an active region is covered with a photo-resist mask (not shown), and the p-type GaAs cap layer 35, the p-type $Al_yGa_{1-y}As$ clad layer 34 and the active layer 33 are partially etched away through a wet etching technique. The photo-resist mask is stripped away. The n-type $Al_yGa_{1-y}As$ clad layer is exposed to the space where a window is formed.

Subsequently, a p-type $Al_zGa_{1-z}As$ optical guide layer 38, an n-type $Al_zGa_{1-z}As$ current blocking layer 39 and an n-type GaAs current blocking layer 40 are successively grown on the entire surface of the resultant semiconductor structure. The space is buried with these layers 38/39/40. The layers 38/39/40 in the space are referred to as a window region. The resultant semiconductor structure is partially covered with a photo-resist mask, and the part of the resultant semiconductor structure over the active region is exposed to wet etchant. The p-type $Al_zGa_{1-z}As$ optical guide layer 38, the n-type $Al_zGa_{1-z}As$ current blocking layer 39 and the n-type GaAs current blocking layer 40 are partially etched away in the wet etchant until the p-type GaAs cap layer 35 is exposed, again. The part of the semiconductor structure over the active region is made coplanar with the remaining part of the semiconductor structure or the window region.

An $SiO_2$ stripe 51 is formed on the resultant semiconductor structure, and extends over the window region and the part of the layers 38/39/40 over the active region. Using the $SiO_2$ stripe 51 as an etching mask, the semiconductor structure is shaped into the striped mesa by using a wet etching, and the p-type $Al_yGa_{1-y}As$ clad layer 34 are decreased to 0.3–0.4 micron thick on both sides of the remaining semiconductor structure under the $SiO_2$ stripe 51.

An n-type GaAs current blocking layer 41 is selectively grown without removing the SiO$_2$ stripe 51 so as to bury the space on both sides of the remaining semiconductor structure under the SiO$_2$ stripe 51.

Finally, the SiO$_2$ stripe is removed from the part of the semiconductor structure over the active region. A p-type electrode 36 is formed over the resultant semiconductor structure, and an n-type electrode 37 is formed on the reverse surface of the n-type GaAs substrate 31. The resultant semiconductor structure is cleaved along the center of the window region, and the prior art window type semiconductor laser light emitting device is completed as shown in FIG. 1. The p-type Al$_z$Ga$_{1-z}$As optical guide layer 38 vertically extends in the window region, and the n-type GaAs current blocking layer 41 horizontally extends as similar to the active region for a mode control. The transverse mode light is coupled from the active region to the window region. The window region has wave-guides in both of the vertical and horizontal directions and the transverse mode light is reciprocally propagated in the window region. The beam shape is less deformed, and, accordingly, the coupling loss is small. The oscillating light is guided in the window region, and vertically passes the cleavage. For this reason, the output light beam does not incline.

Other prior art devices are described hereinbelow. Another semiconductor laser light emitting device is disclosed in Japanese Patent Publication of Unexamined Application (laid-open) No. 56-8890. The prior art semiconductor laser emitting device has a pair of epitaxial layers wider in forbidden band width than an active layer, and the active layer is sandwiched between the epitaxial layers. A pair of thick epitaxial layers is grown on one of the epitaxial layers which is closer to the semiconductor substrate than the other in such a manner as to cover a pair of end surfaces of the active layer extending in parallel to the reflecting surface of the resonator. The pair of thick epitaxial layers makes the refractive index large, and realizes an optical wave-guide transparent to the laser light. However, crystal defects are liable to take place in the prior art semiconductor laser emitting device, and the electrodes and the reflecting surface are degraded due to the heat.

Another prior art window type semiconductor laser light emitting device is disclosed in Japanese Patent Publication of Unexamined Application No. 64-42884. The prior art semiconductor laser light emitting device is of the type having a heterojunction, and the transverse mode oscillation is stable. However, the diffraction loss is serous. Accordingly, the threshold current is increased, and the optical damage possibly takes place.

Yet another prior art window type semiconductor laser light emitting device is disclosed in Japanese Patent Publication of Unexamined Application (laid-open) No. 5-67837. The prior art window type semiconductor laser light emitting device has an active layer sandwiched between clad layers, and the active layer and the clad layers form a double heterojunction structure. The active region including the active layer is buried in a buried layer, the forbidden band width of that is greater than that of the active layer. The buried layer provides window regions on both sides of the active region. The window region is formed by plural semiconductor layers different in forbidden band width, the plural semiconductor layers provide a wave-guide. However, it is difficult to spatially match the dispersion of optical intensity in the wave-guide in the active region and the dispersion of optical intensity in the wave-guide in each window region. For this reason, it is impossible to sufficiency increase the coupling efficiency between the window portions and the active region. This results in that a far field pattern is deformed. In case where the wave-guide in the active region is to be offset from the wave-guides in the window regions, the far field pattern is serious due to large wave-guide loss and the deformation of the wave surface. Moreover, the astigmatic difference takes place in both vertical/horizontal directions.

A prior art semiconductor optical device is disclosed in Japanese Patent Publication of Unexamined Application (laid-open) No. 6-112588. The prior art semiconductor optical device includes a first clad layer, an optical wave-guide layer, a quantum well layer and a second clad layer with a mesa structure successively formed on a substrate. The second clad layer is buried in a current blocking layer. Although the reflectivity in the direction of the stripe is decreased, it is difficult to perfectly restrict the Fabry-P rot mode, and the oscillation light is still absorbed at the end surface. Thus, there are various problems in the prior art semiconductor optical devices.

One of the technical goals is to decrease the coupling loss between the wave-guide in the active region and the wave-guide in the window region. In the prior art window type semiconductor laser light emitting device shown in FIG. 1, the oscillating laser light is vertically confined in the p-type Al—$_z$Ga$_{1-z}$As optical guide layer 38, and the coupling loss is decreased by appropriately locating the p-type Al$_z$Ga$_{1-z}$As optical guide layer 38 with respect to the active layer 33. However, the semiconductor wafer is dispersed in thickness, and the etching is not precisely controlled. The etching depth to be required is of the order of 2 microns, and the dispersion is never ignoreable. In this situation, it is difficult to precisely control the relative position between the p-type Al$_z$Ga$_{1-z}$As optical guide layer 38 and the active layer 33 all over the commercial products.

Though not described in detail in Japanese Patent Publication of Unexamined Application No. 3-14281, an etching stopper is effective against the dispersion. Even if the problem inherent in the prior art semiconductor laser light emitting device shown in FIG. 1 is solved by using an etching stopper, another problem is encountered in the scattering loss due to the p-type Al$_z$Ga$_{1-z}$As optical guide layer 38 left on the sloop between the active region and the window region, and the coupling efficiency in the vertical transverse mode is still low at the boundary between the window region and the active region. This is the first problem.

The location of the bottom surface of the mesa is an important parameter to determine the horizontal light confining structure in the window region. This means that the manufacturer is required to exactly locate the mesa structure at a target position. As described hereinbefore, when the mesa structure is formed, the window region is covered with the photo-resist mask, and the uncovered portion is exposed to the wet etchant. The compound semiconductor layers 38/39/40 are etched away from the uncovered portion until the p-type GaAs cap layer 35 is exposed. The depth is dependent of the etching time, and, accordingly, the wet etching is controlled with time. Then, the active region is planarized with the window region. Thus, the mesa structure is formed through the wet etching. This means that the location of the mesa structure is dependent on the controllability of the planarization. In detail, a dispersion of the relative relation between the mesa bottom in the window region and the mesa bottom in the active region is dependent on the dispersion of step between the window region and the active region upon completion of the planarization. The dispersion of the relative relation is causative of a dispersion of the coupling efficiency between the window region and the active region for the oscillation light in the horizontal transverse mode.

An actual dispersion is hereinbelow discussed. When the semiconductor laminated structure 38/39/40 is completed, the step takes between the window region and the active region, and the dispersion of the step over the semiconductor wafer is equivalent to the dispersion in the thickness of the compound semiconductor layers 38/39/40 or more serious than it. Upon completion of the wet etching, the dispersion of the step between the window region and the active region is further dependent on the dispersion of the depth over the semiconductor wafer, and is determined from both of the dispersion in the step and the dispersion of the depth.

Even though the etching stopper enhances the controllability of the wet etching and makes the dispersion of the depth insignificant, the dispersion of the thickness is still left on the semiconductor wafer, and the dispersion of the coupling efficiency takes places at the boundary between the window region and the active region in the horizontal transverse mode due to the dispersion of the thickness. This is the second problem.

Even if the window region is equalized in height with the active region, roughness is still left around the boundary between the window region and the active region. The rough surface results in roughness of the mesa bottom around the boundary upon completion of the mesa stripe through the etching. Moreover, the width of the $SiO_2$ stripe 51 is not constant due to the irregularity of the thickness of the photo-resist mask formed over the rough surface. This results in that the mesa bottom is not constant in width. The roughness and the non-uniform width makes large scattering loss against the oscillation light in the horizontal transverse mode. This is the third problem.

SUMMARY OF THE INVENTION

It is therefore an important object of the present invention to provide a window type semiconductor laser light emitting device, which has a low coupling loss at the boundary between a window region and an active region in the transverse mode and a low scattering loss at the boundary.

It is also an important object of the present invention to provide a process for fabricating the window type semiconductor laser light emitting device.

In accordance with one aspect of the present invention, there is provided a window type semiconductor laser light emitting device comprising a substrate having a major surface, a laminated structure allowing electric current to flow therethrough and including a first clad layer formed over the major surface and having a first area and second areas on both sides of the first area and closer to the major surface than the first area, an active layer formed on the first area of the first clad layer and generating laser light from the electric current, a second clad layer formed on the active layer and forming a resonator together with the active layer and a part of the first clad layer having the first area and a third clad layer formed over the second clad layer and having side portions laterally projecting from both sides of the second clad layer and buried window layers formed of a first compound semiconductor material having large resistivity against the electric current on the second areas and under the side portions of the third clad layer and transparent to the laser light for providing window regions contiguous to the resonator, the buried window layers have upper surfaces substantially coplanar with an upper surface of the second clad layer, and a difference between the upper surfaces of the buried window layers and the upper surface of the second clad layer is equal to or less than 0.1 micron.

In accordance with another aspect of the present invention to provide a process for fabricating a window type semiconductor laser emitting device comprising the steps of preparing an epitaxial growing system having sources of elements, sources of dopant impurities and a source of inhibitor for restricting an epitaxial growth in a predetermined direction, epitaxially growing a first clad layer of a first conductivity type, an active layer and a second clad layer of a second conductivity type opposite to the first conductivity type on a major surface of a substrate of a first compound semiconductor material having a crystal plane close to a predetermined crystal plane, covering a first area of the second clad layer with an etching mask, selectively etching the second clad layer and the active layer until second areas of the first clad layer is exposed so as to form a step configuration having upper surfaces, first lower surfaces, second lower surfaces on both sides of the first lower surfaces and side surfaces formed between the upper surfaces and the first and second lower surfaces, epitaxially growing a second semiconductor material on the side surfaces so as to fill grooves defined by the upper surfaces, the first and second lower surfaces and the side surfaces by regulating the inhibitor, and completing a window type semiconductor laser light emitting device.

BRIEF DESCRIPTION OF THE DRAWINGS

The features and advantages of the semiconductor laser light emitting device and the process will be more clearly understood from the following description taken in conjunction with the accompanying drawings in which.

DESCRIPTION OF THE PREFERRED EMBODIMENT

Process

FIGS. 2A to 2G illustrate a process for fabricating a window type semiconductor laser emitting device embodying the present invention. In the fabrication process, III–V compound semiconductor materials are grown through a metal organic vapor phase epitaxial technique. The metal organic vapor phase epitaxial growth system has several sources of element. The source of gallium is tri- methyl gallium, which is abbreviated as "TMG". The source of aluminum is tri-methyl aluminum, which is abbreviated as "TMA". The source of indium is a tri- methyl indium, which is abbreviated as "TMI". The source of arsenic is arsine $AsH_3$. Silicon serves as an n-type dopant impurity, and the source of silicon is silane $SiH_4$. Magnesium serves as a p-type dopant impurity, and the source of magnesium is cyclopentadienylmagnesium $Cp_2Mg$. Those sources are selectively supplied to the reactor of the metal organic vapor phase epitaxial system.

The process starts with in n-type GaAs substrate 1. The n-type GaAs substrate 1 is inclined at 0.5 degrees from (100) plane toward [1-11] direction. The n-type GaAs substrate 1 is doped with silicon at $1\times10^{18}$ $cm^{-3}$.

The n-type GaAs substrate 1 is placed in the reactor, and an n-type clad layer 2, an undoped multiple quantum well layer 3 and a p-type clad layer 4 are successively grown on the major surface of the n-type GaAs substrate 1. The n-type clad layer 2 is formed of $Al_{0.2}Ga_{0.8}As$, and silicon is doped at $1\times10^{17}$ cm$^{-3}$. The aluminum gallium arsenide is grown to 2 microns thick at 760 degrees in centigrade.

The undoped multiple quantum well layer 3 serves as an active layer, and the active layer is hereinbelow also labeled with "3". An $Al_{0.1}Ga_{0.9}As$ layer of 60 nanometers thick, a GaAs layer of 5 nanometers thick, an $In_{0.24}Ga_{0.76}As$ layer of 4 nanometers thick, a GaAs layer of 5 nanometers thick, an $In_{0.24}Ga_{0.76}As$ layer of 4 nanometers thick, a GaAs layer of 5 nanometers thick and an $Al_{0.1}Ga_{0.9}As$ layer of 60 nanometers thick are successively grown on the n-type clad layer 2 at 610 degrees in centigrade for the undoped multiple quantum well layer 3.

Figure 1:
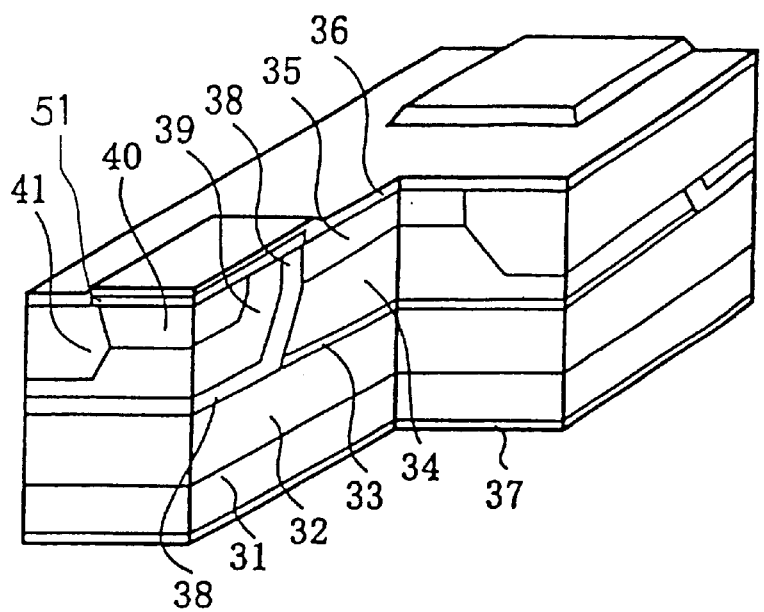
FIG. 1 is a perspective view showing the structure of the prior art window type self-aligned semiconductor laser light emitting device.
Figure 2A:
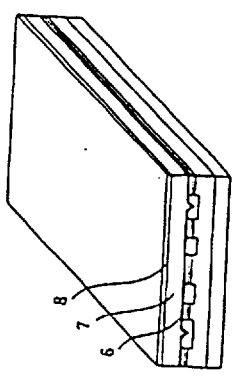
FIGS. 2A to 2G are perspective views showing a process for fabricating a window type semiconductor laser light emitting device according to the present invention.

The p-type clad layer 4 is formed of $Al_{0.2}Ga_{0.8}As$, which is grown to 0.2 micron thick at 610 degrees in centigrade. The $Al_{0.2}Ga_{0.8}As$ layer is doped with magnesium at $2\times10^{18}$ cm$^{-3}$. The resultant compound semiconductor structure is shown in FIG. 2A.

Figure 2B:
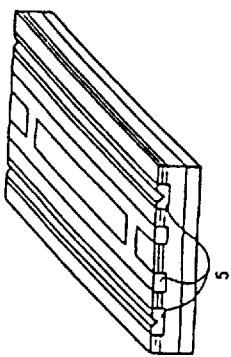

Subsequently, the resultant compound semiconductor structure is selectively covered with a photo-resist etching layer, and the uncovered portion is exposed to wet etchant in the phosphoric acid system. The wet etchant is expressed as $H_3PO_4+H_2O_2+5H_2O$, and the wet etching is carried at 20 degrees in centigrade. The undoped multiple quantum well layer 3 is partially removed from the compound semiconductor structure, and longitudinal grooves and lateral grooves are formed as shown in FIG. 2B. The longitudinal grooves and the lateral grooves are 0.5 micron deep. The n-type clad layer 2 is exposed to the longitudinal grooves like stripes 21/22. The striped areas 21 exposed to the inner longitudinal grooves are 10 microns wide, and are spaced from each other by the active layer 3 of 20 microns wide. The striped area 22 exposed to the outer longitudinal grooves are 20 microns wide, and are spaced from each other by the active layer 3 of 10 microns wide. Although only one pair of outer longitudinal grooves is shown in FIG. 2B, more than one pair of outer longitudinal grooves is formed in the compound semiconductor structure on both sides of the inner longitudinal grooves. The lateral grooves are space in the longitudinal direction at intervals of 900 microns, and the inner grooves are connected through the lateral grooves to each other. The n-type clad layer 2 exposed to the lateral grooves is labeled with 23, and the exposed areas 23 are 10 microns wide.

Figure 2C:
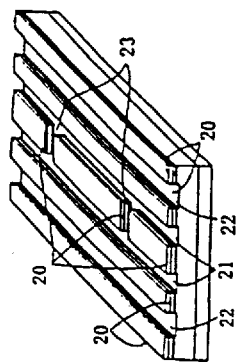

Subsequently, the photo-resist mask 20 is stripped off. Then, the p-type clad layer 4 and the n-type clad layer 2 are exposed, and a step configuration takes place. The striped areas 21/22/23, the striped areas of the p-type lad layer 4 and the sloops therebetween form the step configuration. The resultant compound semiconductor structure is placed in the reactor of the metal organic vapor phase epitaxial system, and $Al_{0.1}Ga_{0.9}As$ is grown to 0.25 micron at 700 degrees in centigrade. The growth is a half of the depth of the longitudinal/lateral grooves. The $Al_{0.1}Ga_{0.9}As$ forms buried window layers 5 in the grooves as shown in FIG. 2C. While the $Al_{0.1}Ga_{0.9}As$ is epitaxially growing on the compound semiconductor structure, hydrochloric acid gas is introduced into the reactor together with the other kinds of gas. The molecular ratio of the hydrochloric acid to Group-III elements, i.e., hydrochloric acid/Group-III elements is regulated to 2. When the molecular ratio is greater than 1, the migration length of Group-III elements is extremely long on crystal planes closer to (100) plane. If there are sloops on both sides of (100) plane, the compound semiconductor material is liable to be grown on the sloops rather than the crystal planes closer to (100) plane. For this reason, $Al_{0.1}Ga_{0.9}As$ is not grown on the upper surfaces of the step configuration, but in the grooves. As described hereinbefore the thickness of the buried window layer 5 is a half of the depth of the grooves, and the outer longitudinal grooves are twice as wide as the inner longitudinal grooves and the lateral grooves. The ratio of the width of the striped area 21 to the total width of the striped area 21 and the adjacent upper surface of the step configuration is equal to or less than 0.5. While the $Al_{0.1}Ga_{0.9}As$ is growing to 0.25 micron, the inner longitudinal grooves are perfectly buried with the $Al_{0.1}Ga_{0.9}As$ in a middle of the growth. Upon creating the flat surface in the inner longitudinal grooves, the $Al_{0.1}Ga_{0.9}As$ migrates to the outer longitudinal grooves because of the long migration length, and is deposited on the sloop of the $Al_{0.1}Ga_{0.9}As$ layers in the outer longitudinal grooves. On the other hand, the ratio of the width of the striped area 22 to the total width of the striped area 22 and the adjacent upper surface is greater than 0.5, and the outer longitudinal grooves are imperfectly buried with the $Al_{0.1}Ga_{0.9}As$ during the epitaxial growth of $Al_{0.1}Ga_{0.9}As$ to 0.25 micron. As a result, a flat surface is created on the buried window layer 5 in the inner longitudinal grooves during the epitaxial growth, and is a crystal plane close to (100) plane. However, narrow grooves are left in the buried window layer 5 in the outer longitudinal grooves as shown.

Figure 2D:
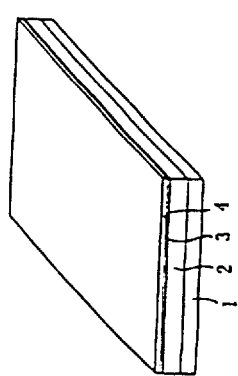

Subsequently, an etching stopper layer 6 is deposited to 0.1 micron thick over the resultant compound semiconductor layer at 700 degrees in centigrade in the reactor of the metal organic vapor phase epitaxial system without taking out from the reactor. The etching stopper layer 6 is formed of p-type $Al_{0.3}Ga_{0.7}As$, and is doped with magnesium at $2\times10^{18}$ cm$^{-3}$. A p-type clad layer 7 and a p-type cap layer 8 are continuously deposited on the etching stopper layer 6. The p-type clad layer 7 is 2 microns thick, and the p-type cap layer 8 is 1 micron thick. The p-type clad layer 7 is formed of $Al_{0.2}Ga_{0.8}As$, and is doped with magnesium at $2\times10^{18}$ cm$^{-3}$. The p-type cap layer 8 is formed of GaAs, and is doped with magnesium at $5\times10^{18}$ cm$^{-3}$. Thus, the p-type etching stopper layer 6, the p-type clad layer 7 and the p-type cap layer 8 are successively laminated on the compound semiconductor structure as shown in FIG. 2D.

Figure 2E:
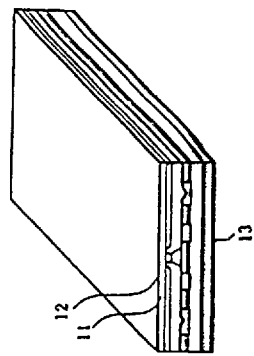

Subsequently, silicon dioxide is deposited over the entire surface of the resultant compound semiconductor structure, and a photo-resist etching mask (not shown) is formed on the silicon dioxide layer. The photo-resist etching mask is located over the area between the inner longitudinal grooves, and is 3 microns wide. Using the photo-resist etching mask, the silicon dioxide layer is selectively etched by using buffered hydrofluoric acid. The striped pattern is transferred to the silicon dioxide layer, and a silicon dioxide strip 24 is left on the p-type GaAs cap layer 8. The resultant compound semiconductor structure is placed in the reactor of a vapor phase etching system such as a reactive ion beam etching system, and is exposed to the gaseous etchant. The p-type GaAs layer 8 and, subsequently, the p-type clad layer 7 are selectively etched away, and the vapor phase etching is continued to a predetermined depth where the p-type clad layer 7 is still left on the etching stopper layer 6. The photo-resist etching mask is stripped off, and a wet etching follows. The wet etchant is in a citric acid system. The wet etchant in the citric acid system has a large selectivity between $Al_{0.2}Ga_{0.8}As$ and $Al_{0.3}Ga_{0.7}As$. The wet etching is rapidly slow-down on the $Al_{0.3}Ga_{0.7}As$ etching stopper layer 7. When the p-type $Al_{0.2}Ga_{0.8}As$ clad layer 7 reaches 7 microns in width, the wet etching stops. Thus, a mesa stripe is formed as shown in FIG. 2E. The p-type $Al_{0.2}Ga_{0.8}As$ strip 7 and the p-type GaAs strip 8 form in combination the mesa stripe.

Figure 2F:
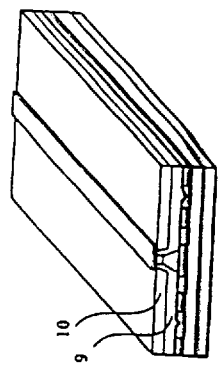

N-type $Al_{0.4}Ga_{0.5}As$ is selectively grown at 700 degrees in centigrade in the reactor of the metal organic vapor phase epitaxial system without removing the silicon dioxide strip 24. The ratio of the hydrochloric acid to Group-III element is regulated to 0.2. The n-type $Al_{0.4}Ga_{0.5}As$ forms a pair of n-type current blocking layers 9 doped with silicon at $3 \times 10^{18}$ $cm^{-3}$. Subsequently, n-type GaAs is selectively grown on the n-type current blocking layer 9, and forms a pair of n-type current blocking layers 10 doped with silicon at $1 \times 10^{19}$ $cm^{-3}$. The mesa stripe is embedded in the n-type current blocking layers 9 and 10 as shown in FIG. 2F.

Figure 2G:
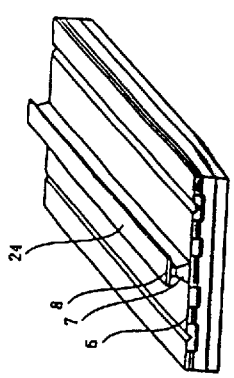

The silicon dioxide strip 24 is removed from the resultant compound semiconductor structure, and p-type GaAs is grown at 650 degrees in centigrade over the entire surface of the compound semiconductor structure. The p-type GaAs forms a p-type contact layer 11 doped with magnesium at $1 \times 10^{19}$ $cm^{-3}$. A p-type electrode 12 is formed on the p-type contact layer 11, and an n-type electrode 13 is formed on the reverse surface of the substrate 1 as shown in FIG. 2G.

The resultant compound semiconductor structure is cleaved along a line offset from the center of the area 23. Then, the window type semiconductor laser light emitting device is completed. The window type semiconductor laser light emitting device is 900 microns in length, and has the window regions of 5 microns long and the active region of 890 microns long. One of the window regions is longer than the other window region, and provides a front end surface of the window type semiconductor laser light emitting device shown in FIG. 3. Though not shown in the drawings, the front end surface is covered with a low reflective coating layer, and the rear end surface is covered with a high reflective coating layer.

The present inventor fabricated samples of the window type semiconductor laser light emitting device through the process described hereinbefore, and measured the step between the upper surfaces of the buried window layers 5 and the upper layer of the clad layer 4. The step was equal to or less than 0.1 micron.

Operation

Figure 3:
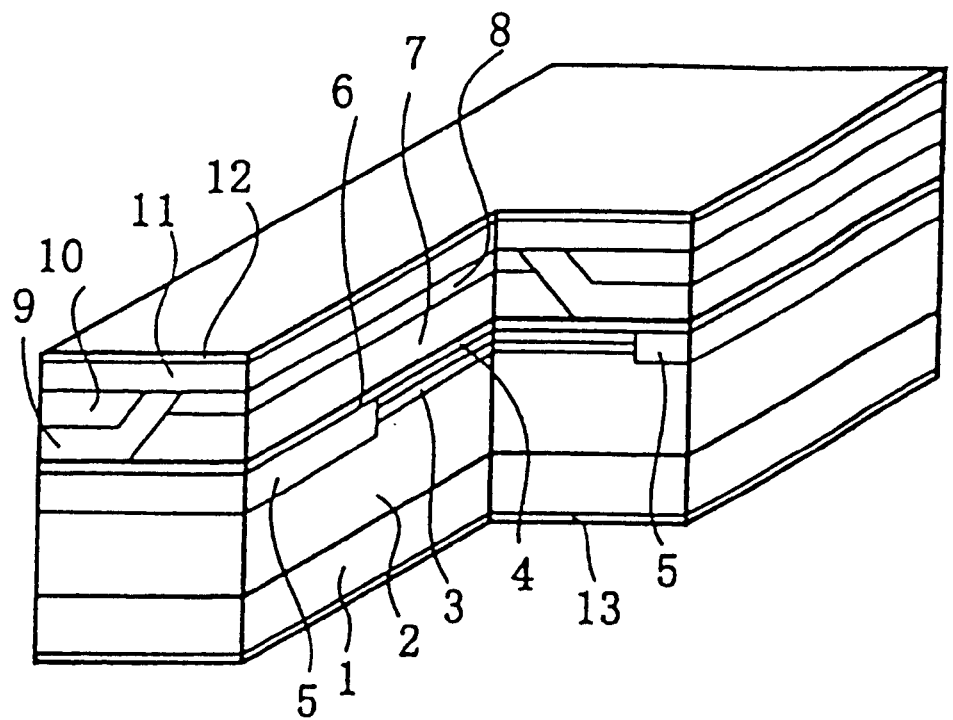
FIG. 3 is a perspective view showing the structure of the window type semiconductor laser light emitting device according to the present invention.

Description is hereinbelow described on the behavior of the window type semiconductor laser light emitting device with reference to FIG. 3. The window type semiconductor laser emitting device is assumed to be forwardly biased between the p-type electrode 12 and the n-type electrode 13. Holes are injected from the p-type electrode 12 into the mesa stripe 8/7, because the n-type GaAs current blocking layers 10 and the n-type $Al_{0.4}Ga_{0.5}As$ current blocking layers 9 are located on both sides of the mesa stripe 8/7. Almost all the holes pass through the p-type GaAs cap layer 8, the p-type $Al_{0.2}Ga_{0.8}As$ clad layer 7, the p-type $Al_{0.3}Ga_{0.7}As$ etching stopper layer 6 and the p-type $Al_{0.2}Ga_{0.8}As$ clad layer 4, and flows into the active layer 3 under the mesa stripe 8/7. The active layer 3 under the mesa stripe serves as the active region. However, the window regions under the mesa stripe 7/8 and the $Al_{0.1}Ga_{0.9}As$ buried window layer 5 spaced from the mesa stripe are so resistive that the injected holes are few.

On the other hand, electrons are injected from the n-type electrode 13 through the n-type GaAs substrate 1 and the n-type $Al_{0.2}Ga_{0.8}As$ clad layer 2 into the active layer 3. However, the electrons are not allowed to flow into the buried window layer 5. Thus, the holes and the electrons are heavily injected into the active region under the stripe, i.e., under the wave-guide, and electric current hardly flows in the window regions.

The injected holes are recombined with the injected electrons, and laser light oscillates in the active region. The laser light passes through the junctions between the active region and the window regions, and is smoothly coupled to the buried window layer 5 at a low coupling loss. The laser light is propagated through the window regions, and are reflected on the end surfaces. The reflection is propagated through the window regions, and is coupled to the wave-guide in the active region at a low coupling loss. The laser light repeats the coupling to the window regions at the high efficiency and the reflection at the end surfaces. This results in the amplified oscillation. The refractive index of the buried window layer is adjusted in such a manner that the laser light beam has a cross section in the vertical transverse mode identical between the active region and the window regions. In other words, the laser beam in the vertical transverse mode has the spot size substantially identical between the active region and the window regions. The buried window layer is not injected with the carriers. This means that the refractive index is never varied due to the injection of carriers. Thus, the laser light is stably coupled in the vertical transverse mode between the active region and the window regions at the high efficiency.

As to the laser light in the horizontal transverse mode, both of the active and window regions are embedded between the n-type current blocking layers 9/10, and the wave-guide in the active region is identical in cross section with the wave-guides in the window regions. This results in a negligible amount of loss against the laser light in the horizontal transverse mode at the boundary between the active region and the window regions.

As will be appreciated from the foregoing description, the buried window layers 5 are formed through the epitaxial growth on the sloops different from the crystal planes close to (100) plane in the longitudinal grooves under the conditions that the molecular ratio of the hydrochloride acid to the Group-III elements is greater than 1. The hydrochloride acid gas may be replaced with chlorine-containing gas. The compound semiconductor is much liable to be grown on the sloops rather than the crystal planes close to (100) plane. For this reason, the buried window layers 5 have the perfectly flat upper surfaces substantially coplanar with the upper surface of the clad layer 4. The buried window layers 5 serve as the vertical light confining layers in the window regions, and the relative relation between the vertical confining layers and the vertical light confined layer in the active region is precisely controlled over the compound semiconductor wafer.

Moreover, the length of the oblique surface at the boundaries between the active region and the window regions is approximately equal to the thickness of the buried window layer. This results in the small coupling loss and the small scattering loss against the laser light in the vertical transverse mode at the boundary between the active region and the window regions.

Finally, the horizontal transverse mode controlling structure is implemented by the cross sectional structure identical between the active region and the window regions, and, for this reason, the coupling loss against the laser light in the horizontal transverse mode is small at the boundaries between the active region and the window regions.

Thus, the window type semiconductor laser light emitting device generates the laser light beam at a high efficiency in the horizontal traverse mode, and is available for the optical communication system.

Although one particular embodiment of the present invention has been shown and described, it will be apparent to those skilled in the art that various changes and modifications may be made without departing from the spirit and scope of the present invention. For example, the present invention is applicable to a window type semiconductor laser light emitting device in the In-GaAsP/ GaAs system or in the AlGaInP/GaAs system.

What is claimed is:

1. A window type semiconductor laser light emitting device comprising a substrate having a major surface;

a laminated structure allowing electric current to flow therethrough and including:

a first clad layer formed over said major surface and having a first area and second areas on both sides of said first area and closer to said major surface than said first area, an active layer formed on said first area of said first clad layer and generating laser light from said electric current, a second clad layer formed on said active layer and forming a resonator together with said active layer and a part of said first clad layer having said first area, and a third clad layer formed over said second clad layer and having side portions laterally projecting from both sides of said second clad layer; and buried window layers formed of a first compound semiconductor material having large resistivity against said electric current on said second areas and under said side portions of said third clad layer and transparent to said laser light for providing window regions contiguous to said resonator, said buried window layers having upper surfaces substantially coplanar with an upper surface of said second clad layer, a difference between said upper surfaces of said buried window layers and said upper surface of said second clad layer being equal to or less than 0.1 micron.

2. The window type semiconductor laser light emitting device as set forth in claim 1, in which said buried window layers have a refractive index adjusted in such a manner that said laser light has a spot size identical between said window regions and said resonator.

3. The window type semiconductor laser light emitting device as set forth in claim 2, in which said third clad layer has a horizontal transverse mode controlling structure.

4. The window type semiconductor laser light emitting device as set forth in claim 1, in which said third clad layer has a horizontal transverse mode controlling structure.

5. The window type semiconductor laser emitting device as set forth in claim 1, in which said substrate is formed of a second compound semiconductor material having a crystal plane closer to (100) plane exposed to said major surface.

6. The window type semiconductor laser light emitting device as set forth in claim 5, in which said crystal plane inclines from said (100) plane at 5 degrees toward direction.

7. The window type semiconductor laser light emitting device as set forth in claim 6, in which said first clad layer, said active layer, said second clad layer and said third clad layer are epitaxial on said crystal plane.

8. The window type semiconductor laser light emitting device as set forth in claim 1, one of said window regions provides a front end surface covered with a low reflective coating layer, and the other of said window regions provides a rear end surface covered with a high reflective coating layer.

* * * * *

UNITED STATES PATENT AND TRADEMARK OFFICE
CERTIFICATE OF CORRECTION

PATENT NO. : 6,385,225 B1
DATED : May 7, 2002
INVENTOR(S) : Kazuo Fukagai

It is certified that error appears in the above-identified patent and that said Letters Patent is hereby corrected as shown below:

Column 7,
Line 6, delete "$cm^{31\ 3}$." insert -- $cm^{-3.}$ --;
Line 21, delete "$cm^{31\ 3}$." insert -- $cm^{-3.}$ --;

Column 8,
Line 41, delete "$cm^{31\ 3}$." insert -- $cm^{-3}$. --.

Signed and Sealed this

Fifteenth Day of October, 2002

*Attest:*

JAMES E. ROGAN
*Director of the United States Patent and Trademark Office*

*Attesting Officer*